United States Patent
Russell et al.

(10) Patent No.: US 7,741,429 B2
(45) Date of Patent: Jun. 22, 2010

(54) PROCESS FOR PREPARING STABLE PHOTORESIST COMPOSITIONS

(75) Inventors: William Richard Russell, Miamisburg, OH (US); John Anthony Schultz, Kettering, OH (US)

(73) Assignee: DuPont Electronic Polymers L.P., Research Triangle Park, NC (US)

( * ) Notice: Subject to any disclaimer, the term of this patent is extended or adjusted under 35 U.S.C. 154(b) by 670 days.

(21) Appl. No.: 11/601,242

(22) Filed: Nov. 17, 2006

(65) Prior Publication Data

US 2007/0148587 A1   Jun. 28, 2007

(51) Int. Cl.
*C08G 79/00*   (2006.01)

(52) U.S. Cl. .................. 528/395; 528/408; 528/501; 528/502 A; 528/482

(58) Field of Classification Search .................. 528/395, 528/408, 501, 502 A, 482
See application file for complete search history.

(56) References Cited

U.S. PATENT DOCUMENTS

| | | | | |
|---|---|---|---|---|
| 5,021,160 | A * | 6/1991 | Wolpert | 210/500.35 |
| 6,379,551 | B1 * | 4/2002 | Lee et al. | 210/638 |
| 7,371,800 | B2 * | 5/2008 | Sheehan et al. | 525/390 |
| 2001/0027245 | A1 * | 10/2001 | Moroishi et al. | 528/480 |
| 2002/0028911 | A1 * | 3/2002 | Barnette et al. | 528/400 |
| 2005/0107547 | A1 * | 5/2005 | Ohno et al. | 525/329.7 |

FOREIGN PATENT DOCUMENTS

| | | |
|---|---|---|
| EP | 1479700 A1 * | 11/2004 |
| WO | WO 9414858 A1 * | 7/1994 |

* cited by examiner

*Primary Examiner*—Amanda C. Walke
(74) *Attorney, Agent, or Firm*—James J. Mullen

(57) ABSTRACT

A method of making a stable photoresist solution containing a polymer from a solution of a polymer containing trace metals, said method comprising the steps of:
(a) providing a polymer solution containing a polymer, a first solvent and trace metals;
(b) passing said polymer solution through an acidic cation ion exchange material to remove said trace metals therefrom and thereby forming a polymer solution containing free acid radicals;
(c) precipitating said polymer from said polymer solution of step b by contacting with a second solvent wherein the polymer is substantially insoluble therein;
(d) filtering said solution and said second solvent to thereby form a solid polymer cake;
(e) contacting said cake from step d with sufficient quantities of additional said second solvent in order to remove free acid radicals therefrom;
(f) adding a compatible photoresist solvent to said solid polymer cake from step e and mixing the two in order to dissolve said polymer in said photoresist solvent and thereby forming a photoresist solution; and
(g) removing any residual first and second solvents from said photoresist solution containing said polymer to form a stable photoresist solution.

7 Claims, No Drawings

PROCESS FOR PREPARING STABLE PHOTORESIST COMPOSITIONS

BACKGROUND OF THE INVENTION

1. Field of the Invention

The present invention relates to processes for preparing stable photoresist compositions.

2. Description of the Prior Art

There is a desire in the industry for higher circuit density in microelectronic devices that are made using lithographic techniques. One method of increasing the number of components per chip is to decrease the minimum feature size on the chip, which requires higher lithographic resolutions. The use of shorter wavelength radiation (e.g., deep UV e.g. 190 to 315 nm) than the currently employed mid-UV spectral range (e.g. 350 nm to 400 nm) offers the potential for higher resolution. However, with deep UV radiation, fewer photons are transferred for the same energy dose and higher exposure doses are required to achieve the same desired photochemical response. Further, current lithographic tools have greatly attenuated output in the deep UV spectral region.

In order to improve sensitivity, several acid catalyzed chemically amplified resist compositions have been developed such as those disclosed in U.S. Pat. No. 4,491,628 (Jan. 1, 1985) and Nalamasu et al, "An Overview of Resist Processing for Deep UV Lithography", 3. Photopolymer Sci. Technol. 4, 299 (1991). The resist compositions generally comprise a photosensitive acid generator and an acid sensitive polymer. The polymer has acid sensitive side chain (pendant) groups that are bonded to the polymer backbone and are reactive towards a proton. Upon imagewise exposure to radiation, the photoacid generator produces a proton. The resist film is heated and, the proton causes catalytic cleavage of the pendant group from the polymer backbone. The proton is not consumed in the cleavage reaction and catalyzes additional cleavage reactions thereby chemically amplifying the photochemical response of the resist. The cleaved polymer is soluble in polar developers such as alcohol and aqueous base while the unexposed polymer is soluble in non-polar organic solvents such as anisole. Thus the resist can produce positive or negative images of the mask depending of the selection of the developer solvent. Although chemically amplified resist compositions generally have suitable lithographic sensitivity, in certain applications, their performance can be improved by (i) increasing their thermal stability in terms of thermal decomposition and plastic flow and (ii) increasing their stability in the presence of airborne chemical contaminants. For example, in some semiconductor manufacturing processes, post image development temperatures (e.g. etching, implantation etc.) can reach 200° C. Brunsvold et al., U.S. Pat. No. 4,939,070 (issued Jul. 3, 1990) and U.S. Pat. No. 4,931,379 (issued Jun. 5, 1990) disclose chemically amplified, acid sensitive resist compositions having increased thermal stability in the post image development stage. Brunsvold's resist compositions form a hydrogen bonding network after cleavage of the acid sensitive side chain group to increase the thermal stability of the polymer. Brunsvold avoids hydrogen-bonding moieties prior to the cleavage reaction because such hydrogen bonding is known to unacceptably destabilize the acid sensitive side chain. Although Brunsvold resists have suitable thermal stability, they also have lower sensitivity and therefore are unsuitable in certain applications.

With respect to chemical contamination, MacDonald et al. SPIE 14662. (1991) reported that due to the catalytic nature of the imaging mechanisms, chemically amplified resist systems are sensitive toward minute amounts of airborne chemical contaminants such as basic organic substances. These substances degrade the resulting developed image in the film and cause a loss of the linewidth control of the developed image. This problem is exaggerated in a manufacturing process where there is an extended and variable period of time between applying the film to the substrate and development of the image. In order to protect the resist from such airborne contaminants, the air surrounding the coated film is carefully filtered to remove such substances. Alternatively, the resist film is overcoated with a protective polymer layer. However, these are cumbersome processes.

Therefore, there was a need in the art for an acid sensitive, chemically amplified photoresist composition having high thermal stability and stability in the presence of airborne chemical contaminants for use in semiconductor manufacturing. Apparently, this was accomplished in the invention outlined in U.S. Pat. No. 5,625,020 which relates to a photosensitive resist composition comprising (i) a photosensitive acid generator and (ii) a polymer comprising hydroxystyrene and acrylate, methacrylate or a mixture of acrylate and methacrylate. The resist has high lithographic sensitivity and high thermal stability. The resist also exhibits fair stability in the presence of airborne chemical contaminants. However, in the above cited prior art and in U.S. Pat. No. 5,284,930 and U.S. Pat. No. 5,288,850 there is another issue of stability in a photoresist composition in that where there are used acidic cation exchange materials to remove trace metals from the precursor polymer solutions, there remains free acid radicals which carry through the process to the resist composition and render them unstable for the end intended use. Thus, one of the objects of the present invention is an improved process for preparing stable photoresist compositions.

The processes of the present invention provide methods which are fast, clean, and render the photoresist composition very stable over a period of time.

2. Prior Art

The following references are disclosed as general background information.

1. U.S. Pat. No. 4,898,916 discloses a process for the preparation of poly(vinylphenol) from poly(acetoxystyrene) by acid catalyzed transesterification.

2. U.S. Pat. No. 5,239,015 discloses a process for preparing low optical density polymers and co-polymers for photoresists and optical applications.

3. U.S. Pat. No. 5,625,007 discloses a process for making low optical polymers and co-polymers for photoresists and optical applications.

4. U.S. Pat. No. 5,625,020 discloses a process for making a photoresist composition containing a photosensitive acid generator and a polymer comprising the reaction product of hydroxystyrene with acrylate, methacrylate or a mixture of acrylate and methacrylate.

5. EP 0813113 A1, Barclay, discloses an aqueous transesterification to deprotect the protected polymer.

6. WO 94 14858 A discloses polymerizing hydroxystyrene without the protecting group.

Other patents of interest are U.S. Pat. Nos. 4,679,843; 4,822,862; 4,912,173; 4,962.147; 5,087,772; 5,284,930; 5,288,850; 5,304,610; 5,395,871; 5,789,522; 5,939,511; 5,945,251; 6,414,110 B1; 6,787,611 B2; 6,759,483 B2; and 6,864, 324 B2.

All of the references described herein are incorporated herein by reference in their entirety.

SUMMARY OF THE INVENTION

The present invention provides, in part, a method of making a stable photoresist solution containing a polymer from a solution of a polymer containing trace metals, said method comprising the steps of:
(a) providing a polymer solution containing a polymer, a first solvent and trace metals;
(b) passing said polymer solution through an acidic cation ion exchange material to remove said trace metals therefrom and thereby forming a polymer solution containing free acid radicals;
(c) precipitating said polymer from said polymer solution of step b by contacting with a second solvent wherein the polymer is substantially insoluble therein;
(d) filtering said solution and said second solvent to thereby form a solid polymer cake;
(e) contacting said cake from step d with sufficient quantities of additional said second solvent in order to remove free acid radicals therefrom;
(f) adding a compatible photoresist solvent to said solid polymer cake from step e and mixing the two in order to dissolve said polymer in said photoresist solvent and thereby forming a photoresist solution; and
(g) removing any residual first and second solvents from said photoresist solution containing said polymer to form a stable photoresist solution.

DETAILED DESCRIPTION OF THE INVENTION

The present invention thus provides, in part, a novel process for producing polymers free of acid radicals and which then can be used to provide a stable photoresist composition. While the subsequent subject matter is directed to certain polymers, it is to be understood that this is exemplary and a wide range of polymers may be used to prepare polymer solutions for use in the present invention process.

Preparation of the Polymer Solution:

The following is an example of preparing a hydroxyl containing polymer of I,

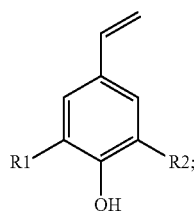

either alone or in combination with an acrylate monomer having the formula II,

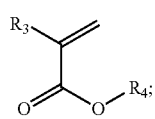

and/or with one or more ethylenically unsaturated copolymerizable monomers (EUCM) selected from the group consisting of styrene, 4-methylstyrene, styrene alkoxide wherein the alkyl portion is $C_1$-$C_5$ straight or branch chain, maleic anhydride, dialkyl maleate, dialkyl fumarate and vinyl chloride, wherein alkyl is having 1 to 4 carbon atoms, comprises the following steps.

Step 1—Polymerization

In this step, a substituted styrene monomer of formula III,

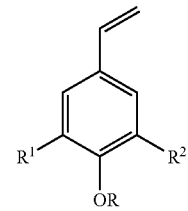

wherein R is either —$C(O)R^5$ or —$R^5$; either alone (if preparing a homopolymer) or in combination with said monomer II, and/or one or more of said copolymerizable monomers (EUCM) is subjected to suitable polymerization conditions in a carboxylic alcohol solvent and in the presence of a free radical initiator at suitable temperature for a sufficient period of time to produce a polymer of corresponding composition.

In the above formulae I, II, and III, the following are the definitions:
i) $R^1$ and $R^2$ are the same or different and independently selected from the group consisting of:
hydrogen;
fluorine, chlorine or bromine;
alkyl or fluoroalkyl group having the formula $C_nH_xF_y$, where n is an integer from 1 to 4,
x and y are integers from 0 to 2n+1, and the sum of x and y is 2n+1; and
phenyl or tolyl;
ii) $R^3$ is selected from the group consisting of:
hydrogen; and
methyl, ethyl, n-propyl, iso-propyl, n-butyl, iso-butyl or t-butyl;
iii) $R^4$ is selected from the group consisting of methyl, ethyl, n-propyl, i-propyl, n-butyl, i-butyl, t-butyl, t-amyl, benzyl, cyclohexyl, 9-anthracenyl, 2-hydroxyethyl, cinnamyl, adamantly, methyl or ethyl adamantly, isobornyl, 2-ethoxyethyl, n-heptyl, n-hexyl, 2-hydroxypropyl, 2-ethylbutyl, 2-methoxypropyl, 2-(2-methoxyethoxyl), 2-naphthyl, 2-phenylethyl, phenyl, and the like.
iv) $R^5$ is $C_1$-$C_5$ alkyl, either straight or branch chain.

It is also within the scope to prepare a homopolymer of formula I from the monomer of formula III. As one preferred embodiment, polyhydroxystyrene (PHS) can be prepared from acetoxystyrene monomer (ASM).

The present scope thus covers (a) a homopolymer of formula I derived from formula III monomer; (b) a copolymer derived from formula II and formula III monomers; (c) a copolymer derived from formula III monomers and the EUCM; and (d) a terpolymer derived from monomers of formula II, formula III and EUCM. It is also within the scope of the present invention to use other monomers such as norbornene monomers, fluorine monomers and the like to form a crude polymer product to be treated by the novel processes of the present invention.

In conjunction with Formula II (an acrylate monomer) set forth herein, some preferred acrylate monomers are (1) MAA—methyl adamantyl acrylate, (2) MAMA—methyl adamantyl methacrylate, (3) EAA—ethyl adamantyl acrylate, (4) EAMA—ethyl adamantyl methacrylate, (5) ETCDA—ethyl tricyclodecanyl acrylate, (6) ETCDMA—ethyl tricyclodecanyl methacrylate, (7) PAMA—propyl adamantyl methacrylate, (8) MBAMA—methoxybutyl adamantyl methacrylate, (9) MBAA—methoxybutyl adamantyl acrylate, (10) isobornylacrylate, (11) isobornylmethacrylate, (12). cyclohexylacrylate, and (13) cyclohexylmethacrylate. Other preferred acrylate monomers which can be used are (14) 2-methyl-2-adamantyl methacrylate; (15) 2-ethyl-2-adamantyl methacrylate; (16) 3-hydroxy-1-adamantyl methacrylate; (17) 3-hydroxy-1-adamantyl acrylate; (18) 2-methyl-2-adamantyl acrylate; (19) 2-ethyl-2-adamantyl acrylate; (20) 2-hydroxy-1,1,2-trimethylpropyl acrylate; (21) 5-oxo-4-oxatricyclo-non-2-yl acrylate; (22) 2-hydroxy-1,1,2-trimethylpropyl 2-methacrylate; (23) 2-methyl-1-adamantyl methacrylate; (24) 2-ethyl-1-adamantyl methacrylate; (25) 5-oxotetrahydrofuran-3-yl acrylate; (26) 3-hydroxy-1-adamantyl methylacrylate; (27) 5-oxotetrahydrofuran-3-yl 2-methylacrylate; (28) 5-oxo-4-oxatricyclo-non-2-yl 2 methylacrylate.

Additional acrylates and other monomers that may be used in the present invention with the substituted styrene to form various copolymers include the following materials: Monodecyl maleate; 2-hydroxy ethyl methacrylate; isodecyl methacrylate; hydroxy propyl methacrylate; isobutyl methacrylate; lauryl methacrylate; hydroxy propyl acrylate; methyl acrylate; t-butylaminoethyl methacrylate; isocyanatoethyl methacrylate; tributyltin methacrylate; sulfoethyl methacrylate; butyl vinyl ether blocked methacrylic acid; t-butyl methacrylate; 2-phenoxy ethyl methacrylate; acetoacetoxyethyl methacrylate; 2-phenoxy ethyl acrylate; 2-ethoxy ethoxy ethyl acrylate; beta-carboxyethyl acrylate; maleic anhydride; isobornyl methacrylate; isobornyl acrylate; methyl methacrylate; ethyl acrylate; 2-ethyl hexyl methacrylate; 2-ethyl hexyl acrylate; glycidyl methacrylate; N-butyl acrylate; acrolein; 2-diethylaminoethyl methacrylate; allyl methacrylate; vinyl oxazoline ester of meso methacrylate; itaconic acid; acrylic acid; N-butyl methacrylate; ethyl methacrylate; hydroxy ethyl acrylate; acrylamide oil; acrylonitrile; methacrylic acid; and stearyl methacrylate.

Co-polymers having polyhydroxystyrene (PHS) and one or more of the above acrylate monomers are some of the materials that are made by these processes.

In another embodiment in this step 1, the reaction mixture may also comprise an additional co-solvent. The co-solvent is selected from the group consisting of tetrahydrofuran, methyl ethyl ketone, acetone, and 1,4-dioxane.

The carboxylic alcohol solvent is an alcohol having 1 to 4 carbon atoms and is selected from the group consisting of methanol, ethanol, isopropanol, tert-butanol, and combinations thereof The amount of solvent (and/or second solvent) used is not critical and can be any amount which accomplishes the desired end result.

The free radical initiator may be any initiator that achieves the desired end result. The initiator may be selected from the group consisting of 2,2'-azobis(2,4-dimethylpentanenitrile), 2,2'-azobis(2-methylpropanenitrile), 2,2'-azobis(2-methylbutanenitrile), 1,1'-azobis(cyclohexanecarbonitrile), t-butyl peroxy-2-ethylhexanoate, t-butyl peroxypivalate, t-amyl peroxypivalate, diisononanoyl peroxide, decanoyl peroxide, succinic acid peroxide, di(n-propyl) peroxydicarbonate, di(sec-butyl) peroxydicarbonate, di(2-ethylhexyl) peroxydicarbonate, t-butylperoxyneodecanoate, 2,5-dimethyl-2,5-di (2-ethylhexanoylperoxy)hexane, t-amylperoxyneodecanoate, dimethyl 2,2'-azobisisobutyrate and combinations thereof.

As a preferred embodiment, the initiator is selected from the group consisting of 2,2'-azobis(2,4-.dimethylpentanenitrile), 2,2'-azobis(2-metbylpropanenitrile), 2,2'-azobis(2-methylbutanenitrile), 1,1'-azobis(cyclohexanecarbonitrile), t-butyl peroxy-2-ethylhexanoate, t-butyl peroxypivalate, t-amyl peroxypivalate, and combinations thereof.

The amount of initiator is any amount that accomplishes the desired end result. However, as a preferred embodiment, said initiator is present to about three mole percent based upon the total moles of all of said monomers I, II, and said copolymerizable monomers.

The polymerization conditions are any temperature and pressure that will produce the desired end result. In general, the temperatures are from about 30° C. to about 100° C., preferably from about 40° C. to about 100° C., and most preferably from about 45° C. to about 90° C. The pressure may be atmospheric, sub-atmospheric or super-atmospheric. The polymerization time is not critical, but generally will take place over a period of at least one minute in order to produce a polymer of corresponding composition.

Step 2—Purification

After the polymerization of step 1 and if one so desires, and prior to the transesterification of step 3, the polymer from step 1 is subjected to a purification procedure wherein the same type carboxylic alcoholic solvent (first solvent) is used to purify the polymer via a multi-step fractionation process. Additional first solvent is added to the polymer mixture of step 1, and the resultant slurry is stirred vigorously and/or heated to boiling (about 66° C.) for several minutes, and then chilled to as low as 25° C. and allowed to stand. This permits the slurry to produce a phase separation, and then the liquid is removed by centrifugation, filtration, decantation or by similar means. The process is repeated at least one more time until no further purification is identified, as for example, until a small sample of the decanted solvent, upon evaporation to dryness shows substantially no residue. This fractionation process is generally carried out 2 to 10 times, i.e. heating, cooling, separating, and the solvent replacement.

One of the important measures of the degree of impurity of a crude polymer produced from the polymerization of the monomers is the polydispersity value. In general, it is desirable to have a low value, for example, less than about 3; the lower value is indicative that the polymerization reaction was more uniform in chain length. The uniqueness of this purification step is that the desired polymer formed is, to some degree, not soluble in the solvent and that the undesired, low molecular weight average polymers and undesired monomers are soluble in the solvent. Thus the novel purification/fractionalization provides the removal of these undesirable materials. In general, the polydispersity of the crude polymer is measured before, during and after this purification/fractionalization step, with the objective of reducing this value by at least about 10% of what the value of the original crude polymer was before the purification treatment. Preferably, it is desirable to yield a product whose polydispersity is below about 2.0. It is to be understood that polydispersity means the ratio of weight average molecular weight (Mw) over the number average molecular weight (Mn) as determined by Gel Permeation Chromatography (GPC).

Step 3—Transesterification

In transesterification step, the polymer/solvent mixture from step 2 is subjected to transesterification conditions in said alcohol solvent in the presence of a catalytic amount of a transesterification catalyst. The catalyst is such that it will not substantially react with the polymer, or said alkyl acrylate monomer H, or with said co-polymerizable monomers (EUCM). The catalyst is selected from the group consisting of (anhydrous) ammonia, lithium methoxide, lithium ethoxide, lithium isopropoxide, sodium methoxide, sodium ethoxide, sodium isopropoxide, potassium methoxide, potassium ethoxide, potassium isopropoxide, cesium methoxide, cesium ethoxide, cesium isopropoxide, and combinations thereof, wherein the carboxylic alkoxide anion is similar to the carboxylic alcohol solvent. It is also to be understood that the catalyst can be alkali metal hydroxides such as lithium hydroxide, sodium hydroxide, potassium hydroxide, cesium hydroxide and combinations thereof. If the monomer being used is —R where it is —$R^5$, then the catalyst is a strong acid such as mineral acids such as HCL.

The amount of catalyst employed is from about 0.1 mole percent to about 2 mole percent of monomer I present in the composition of said polymer.

In a preferred embodiment, the catalyst is added in step (b) as a solution in said alcohol solvent.

The temperature in step (b) is such that the transesterified by-product ester formed can be continually removed from the reaction mixture to form the polymer of I, II, and said copolymerizable monomer. Such temperatures can be from about 50° C. to about 200° C. In a preferred embodiment, the transesterification reaction is carried out at reflux temperature of said alcohol solvent.

Step 4—Purification

This optional purification step comes before the catalyst removal step. According to this step 4, there is added to the polymer in an alcoholic solution, a second solvent which is immiscible with said alcohol solvent until a second layer is formed. The mixture is then stirred vigorously or is heated to boiling for several minutes and then allowed to stand until cool. A discrete second layer is formed which is then removed by decantation or similar means, and the process is repeated until no further purification is identified, as for example, until a small sample of the decanted second (non-alcohol) solvent upon evaporation to dryness shows no residue. In this fashion, there are removed by-products and low weight average molecular weight materials.

The alcoholic solution of the polymer is then subjected to distillation to remove the remaining second solvent, which was miscible in the alcohol. Most often removal of the second solvent is accomplished by azeotropic distillation; the azeotropic mixture boiling below the boiling temperature of either the alcohol or the second solvent.

Typical second solvents useful for the method of this step include hexane, heptane, octane, petroleum ether, ligroin, lower alkyl halohydrocarbons, i.e., methylene chloride, and the like.

Present Invention Process Steps:

Step A: Providing a Polymer Solution.

At this point, there has been prepared a polymer solution (as set forth above) which contains a polymer, a first solvent, and trace metals and which is now the starting material for the novel process of the present invention.

Step B: Removal of the Trace Metals.

In view of the nature of the catalyst employed in step 3 above, it is critical that any trace metals derived from the catalyst used be removed from the system. In this step, there is employed a cation-exchange resin, preferably an acidic cation exchange resin, to accomplish the desired end result. An acidic ion exchange resin, such as sulfonated styrene/ divinylbenzene cation exchange resin in hydrogen-form is preferably utilized in the present process. Suitable acidic exchange resins are available from Rohm and Haas Company, e.g. AMBERLYST 15 acidic ion exchange resin. These Amberlyst resins typically contain as much as 80,000 to 200,000 ppb of sodium and iron. Before being utilized in the process of the invention, the ion exchange resin should be treated with water and then a mineral acid solution to reduce the metal ion level. When removing the catalyst from the polymer solution, it is important that the ion exchange resin be rinsed with a solvent that is the same as, or at least compatible with, the polymer solution solvent. The procedure in this step B may be similar to those procedures disclosed in U.S. Pat. No. 5,284,930 and U.S. Pat. No. 5,288,850. Generally, the cation-exchange procedure is conducted at any temperature, pressure, and flow rate which accomplishes the desired end result.

Step C: Precipitation of Polymer

In this step, the polymer is separated from the first solvent by contacting the polymer solution with a second solvent in which the polymer is substantially insoluble therein. Precipitation occurs when this contact process takes place. The second solvent is generally from the group consisting of water, hexanes, heptanes, octanes, petroleum ether, ligroin, lower alkyl halohydrocarbons (such as methylene chloride), and mixtures thereof. This also includes mixed isomers of all the alkanes.

For exemplary purposes, the polymer solution is precipitated by metering the 27-30% solids solution in methanol into agitated 18 MΩ, de-ionized water at room temperature and a 1:10 polymer solution to water ratio. The rate of stirring or agitation is such that the end result is a product is a filterable particulate. Metered charge rate of the polymer solution is generally 10-15 wt % of polymer solution/min into the agitated de-ionized water (e.g. 6-8 kg/min for 60 kg polymer solution into 600 kg DI $H_2O$). This charge rate allows for an optimum precipitated particle size, conducive with adequate filtration and washing schemes. The result of this step is a slurry mixture of precipitated polymer particles in a water/methanol medium, in which the majority of the polymer is insoluble (some low molecular weight fragments of the polymer and impurities may be soluble in the resultant water/methanol solution). The acidic species from the ion exchange (IEX) resin step are soluble in the mother liquor solvent.

In conjunction with the first and second solvents, these are polymer specific in that the first solvent is any solvent wherein the polymer is substantially soluble therein and the second solvent is any solvent wherein the polymer is substantially insoluble therein. Thus, in conjunction with the solvents mentioned herein, one solvent could be used as the first solvent for a certain polymer, but for another polymer, the same solvent would not be suitable and a different solvent would be utilized.

Step D: Filtration

In this step, the polymer solution, the second solvent, and the precipitated polymer are filtered in order to provide a substantially solid polymer cake. This filtration can be conducted via gravity or via use of a vacuum.

For exemplary purposes, the polymer slurry, consisting of precipitated polymer particles and a water/methanol solution, is filtered at room temperature through a 25-30 μm filter to separate/isolate the polymer particles from the water/methanol solution. The polymer particles are trapped on the filter and the water/methanol solution passes through, taking any soluble low molecular weight polymer fragments and impurities including acidic impurities from the acid EEX resin step with it into waste. The result is a polymer wetcake that is wet with water/methanol. The filtration is typically performed under centrifugal force or vacuum conditions to further remove the undesired water/methanol solution from the polymer wetcake on the filter, down to about 40% to about 60%, for example 50% wet.

It is also within the scope of the present invention wherein the precipitated polymer wet cake can be resolubilized in an appropriate solvent, precipitated in an appropriate solvent and then filtered for at least one more time.

Step E: Washing the Polymer Cake.

In this step, the polymer cake from step D is washed at least one time with sufficient quantities of additional and fresh second solvent in order to remove the free acid radicals therefrom. While this step provides for the removal of the acid radicals therefrom, there still is present small quantities of said first and second solvents.

For exemplary purposes, the polymer wetcake is washed on the filter with fresh de-ionized water in order to reduce the amount of methanol in the polymer and further remove any soluble low molecular weight fragments and impurities including acidic impurities from the EX resin step. The washing is performed over 1-10 minutes with low agitation at room temperature, and atmospheric pressures. The charge amount of fresh de-ionized water is about 50-67 wt % of the weight of the pre-washed wetcake, or about 30-50 wt % of the starting polymer solution prior to precipitation. This charge amount of water washing provides for adequate removal of the methanol from the polymer wetcake to minimize flammability hazards and further remove any soluble low molecular weight polymer fragments and impurities. The result is a re-slurried polymer wetcake in de-ionized water, which is then filtered/isolated as stated in the previous step to remove the wash water. Since the washing is performed on the filter, exposure to additional impurities is minimized, and allows for timely re-isolation of the polymer wetcake. Again, the polymer wetcake is "de-watered" to about 50 wt % wet.

Step F: Solvent Swap

In this step, the solid polymer is solvent exchanged and dissolved in an aprotic/organic solvent which is a photoresist compatible (PC) solvent. This PC solvent is at least one member selected from glycol ethers, glycol ether acetates and aliphatic esters having no hydroxyl or keto group. Examples of the solvent include glycol ether acetates such as ethylene glycol monoethyl ether acetate and propylene glycol monomethyl ether acetate (PGMEA) and esters such as ethyl-3-ethoxypropionate, methyl-3-methoxypropionate, among which PGMEA is preferred. These solvents may be used alone or in the form of a mixture thereof.

Further examples of the PC solvent include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the PC solvent, it preferably accounts for at least 50% by weight of the entire PC solvent. Also when the alkyl lactate is used as the PC solvent, it preferably accounts for at least 50% by weight of the entire PC solvent. When a mixture of propylene glycol alkyl ether acetate and alkyl lactate is used as the PC solvent, that mixture preferably accounts for at least 50% by weight of the entire PC solvent. In this PC solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coaling whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the PC solvent is used in amounts of about 300 to 2,000 parts, preferably about 400 to 1,000 parts by weight per 100 parts by weight of the solids in the chemically amplified positive resist composition. The concentration is not limited to this range as long as film formation by existing methods is possible.

Step G: First and Second Solvent Removal.

In this step, the resultant photoresist solution containing the polymer, and residuals of the first and second solvents are subjected to a distillation process whereby the first and second solvents are removed from the photoresist solution thus providing a stable photoresist composition which has substantially no free acid radicals and no water, i.e. <5000 ppm water.

If one so desires to prepare a final photoresist composition, it is prepared without isolating the photoresist material by directly adding to the photoresist solution (prepared as described above) a photoacid generating (PAG) compound capable of generating an acid upon exposure to actinic radiation (photoacid generator) and if necessary a base and additives for improvement of optical and mechanical characteristics, a film forming property, adhesion with the substrate, etc. optionally in the form of a solution. The viscosity of the composition is regulated by addition of PC solvent, if necessary. The PC solvent used in preparing the resist composition is not necessarily limited to the type of PC solvent having been used in step F, and it is possible to use any other PC solvent which is conventionally used in preparation of a photoresist composition. Further, any photo acid-generating compounds and other additives, which are used conventionally in chemically amplified resists, can also be used. The total solid content in the resist composition is preferably in the range of 9 to 50% by weight, more preferably 15 to 25% by weight, relative to the solvent.

The photoacid generator is a compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used atone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxy-phenyl)phenylsulfonium, tris(4-tert-butoxyphenyl)sulfonium, (3-tert-butoxyphenyl)diphenyl-sulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonyl-methyloxyphenyl)diphenylsulfonium. tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyl-dimethylsulfonium, trimethylsulfonium, 2-oxocyclohexylcyclohexyl-methylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluorooethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodonium cations are arytiodonium cations including diphenyliodinium, bis(4-tert-butylphenyl)iodonium, 4-tert-butoxyphenylphenyliodonium, and 4-methoxyphenylphenyIodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bis-sulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane 2-naphthylsulfonylbenzoyldiazomethane, 4-methylphenylsulfonyl-2-naphthoyldiazomethane, methylsulfonylbenzoyldiazomethane, and tertbutoxycarbonyl-4-methylphenylsulfonyldiazotmethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo [2,2,1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate, Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl) propiophenone, 2-cyclohexylcarbonyl-2-(p-toluenesulfonyl) propane, and 2,4-dimethyl-2-(p-toluenesulfonyl)pentan-3-one.

Photoacid generators in the form of glyoxime derivatives include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexylsulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime.

Of these photoacid generators, the sulfonium salts, bissulfonyldiazomethane compounds, and N-sulfonyloxyimide compounds are preferred.

In the chemically amplified positive resist composition, an appropriate amount of the photoacid generator is 0 to 20 parts, and especially 1 to 10 parts by weight per 100 parts by weight of the solids in the composition. The photoacid generators may be used alone or in a mixture of two or more. The transmittance of the resist film can be controlled by using a photoacid generator having a low transmittance at the exposure wavelength and adjusting the amount of the photoacid generator added.

In conjunction with step G and later additions as set forth above, it is critical that these steps be conducted on an anhydrous basis, i.e. wherein the water level is less than about 5,000 parts per million (ppm), in order to avoid possible side reactions and provide a mechanism to provide a convenient and direct route to a resist composition without having to isolate the polymer product and then carry out additional processing steps.

It is to be understood that in conjunction with the purification steps, set forth above, it is within the scope of this invention to use both of these steps, only one of these steps or neither of these steps.

This invention is further illustrated by the following examples that are provided for illustration purposes and in no way limits the scope of the present invention.

EXAMPLE 1

In a 1 inch diameter PP column, 19 cm. Of water-wet USF A15 resin was added. This material was subjected to a 1 hour flush with 1000 grams of deionized water. The column was drained until 1 inch of deionized water remained above the resin. 500 grams of methanol was added to the column and drained over 2.5 hours until the liquid level reached about 1-2 inches above the resin. The resin was then allowed to soak in the methanol for 12 hours. A second methanol flush was performed in the same manner, and again allowed to soak for an additional 12 hours. After the second methanol soak, the resin was then flushed with an additional 500 grams of methanol over 1 hour and sampled for water; the water retention was 0.08% as determined by KF titration.

1600 grams of a poly(4-hydroxystyrene/t-butoxystyrene) polymer (50:50 mole ratio) was dissolved in methanol and the resultant polymer solution was passed through the ion exchange bed (prepared as set forth above) over a period of 27 hours.

400 grams of the ion exchanged polymer solution was then contacted with deionized water (10:1 mole ratio) whereby the polymer precipitated. The solution and precipitated polymer were filtered on a glass-frit filter and washed twice with fresh deionized water. Each wash was about one half of the precipitation volume. The wet cake polymer was sampled for water and the result was 55.6% as determined by KF titration.

222.9 grams of the polymer wet cake (44.4% solids in deionized water) was added to a round bottom flask and 230.9 grams of ethyl lactate was added to the wet cake polymer to form a 30% solids solution (based on the dry polymer, excluding water). The wet cake formed a large "dough ball" and required mild heating at 40 C. for 3 hours and agitation for 12 hours to fully dissolve. The resultant solution was stripped under vacuum on a rotovap to remove the water and raise the percentage solids to provide a 38-42% range. A total of 194.3 grams of deionized water/ethyl lactate was stripped off (however there were some losses due to an inadequate collection of vapors), bringing the solution to 49.7% solids and a water level of 0.17% based upon KF titration. The solids were adjusted by adding 48.0 grams of ethyl lactate, bringing the solution to 42.5% solids. A second addition of 12.4 grams of ethyl lactate was added to bring the solids to a range of 48% solids. A sample of this final solution was subjected to accelerated stability tests at 75 C. for 4 hours. The resultant material did not turn green in color indicating that the t-butoxy groups did not decompose and thus was stable.

What is claimed is:

1. A method of making a stable photoresist solution containing a polymer from a solution of a polymer containing trace metals, said method which consists of the steps of:
   (a) providing a polymer solution containing a polymer, a first solvent and trace metals;
   (b) passing said polymer solution through an acidic cation ion exchange material to remove said trace metals therefrom and thereby forming a polymer solution containing free acid radicals;
   (c) precipitating said polymer from said polymer solution of step b by contacting with a second solvent wherein the polymer is substantially insoluble therein;
   (d) filtering said solution and said second solvent to thereby form a solid polymer cake;
   (e) contacting said cake from step d with sufficient quantities of additional said second solvent in order to remove free acid radicals therefrom;
   (f) adding a compatible photoresist solvent to said solid polymer cake from step e and mixing the two in order to dissolve said polymer in said photoresist solvent and thereby forming a photoresist solution; and
   (g) removing any residual first and second solvents from said photoresist solution containing said polymer to form a stable photoresist solution.

2. The process as set forth in claim 1 wherein the first solvent is an alcoholic solvent.

3. The process as set forth in claim 1 wherein the second solvent is selected from the group consisting of water, hexanes, heptanes, octanes, petroleum ether, ligroin, lower alkyl halohydrocarbons, and mixtures thereof.

4. The process as set forth in claim 2 wherein said alcoholic solvent is selected from the group consisting of methanol, ethanol, propanol, isoproponal, t-butanol, and mixtures thereof.

5. A method of making a stable polymer from a solution of a polymer containing trace metals, said method which consists of the steps of:
   (a) providing a polymer solution containing a polymer, a first solvent and trace metals;
   (b) passing said polymer solution through an acidic cation ion exchange material to remove said trace metals therefrom and thereby forming a polymer solution containing free acid radicals;
   (c) precipitating said polymer from said polymer solution of step b by contacting with a second solvent wherein the polymer is substantially insoluble therein;
   (d) filtering said solution and said second solvent to thereby form a solid polymer cake; (e) contacting said cake from step d with sufficient quantities of additional said second solvent in order to remove free acid radicals therefrom; and
   (f) removing any residual first and second solvents from said polymer to form a stable polymer.

6. The process as set forth in claim 1 wherein the first solvent is any solvent wherein the polymer is substantially soluble therein.

7. The process as set forth in claim 1 wherein the second solvent is any solvent wherein the polymer is substantially insoluble therein.

* * * * *